United States Patent
Lee et al.

(10) Patent No.: US 10,749,493 B2
(45) Date of Patent: Aug. 18, 2020

(54) BAND PASS FILTER

(71) Applicant: Samsung Electro-Mechanics Co., Ltd., Suwon-si (KR)

(72) Inventors: Hyung Jin Lee, Suwon-si (KR); Seong Jong Cheon, Suwon-si (KR); Jeong Hae Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/276,995

(22) Filed: Feb. 15, 2019

(65) Prior Publication Data
US 2020/0091887 A1 Mar. 19, 2020

(30) Foreign Application Priority Data
Sep. 17, 2018 (KR) .......... 10-2018-0110953

(51) Int. Cl.
*H03H 7/01* (2006.01)
(52) U.S. Cl.
CPC ........ *H03H 7/0161* (2013.01); *H03H 7/0115* (2013.01); *H03H 7/175* (2013.01); *H03H 7/1766* (2013.01); *H03H 7/1783* (2013.01); *H03H 7/1791* (2013.01)

(58) Field of Classification Search
CPC .... H03H 7/175; H03H 7/1758; H03H 7/1766; H03H 7/1783; H03H 7/0115; H03H 7/1791; H03H 7/0161
USPC .................................................. 333/167, 175
See application file for complete search history.

(56) References Cited

U.S. PATENT DOCUMENTS

| | | | |
|---|---|---|---|
| 2011/0241798 A1 | 10/2011 | Hong et al. | |
| 2014/0106698 A1* | 4/2014 | Mi | H03H 7/0123 455/307 |
| 2018/0198433 A1* | 7/2018 | Mori | H03H 7/075 |

FOREIGN PATENT DOCUMENTS

| | | |
|---|---|---|
| KR | 10-1166111 B1 | 7/2012 |
| KR | 10-1321772 B1 | 10/2013 |

* cited by examiner

*Primary Examiner* — Rakesh B Patel
(74) *Attorney, Agent, or Firm* — NSIP Law

(57) ABSTRACT

A band pass filter includes: a first circuit unit including a first series LC resonant circuit disposed between a first terminal and a second terminal; a second circuit unit disposed between the first circuit unit and the second terminal, and including a first parallel LC resonant circuit; and a third circuit unit disposed between the first terminal and a ground, and including a second series LC resonant circuit, wherein a resonant frequency of the first circuit unit is in a pass band.

8 Claims, 5 Drawing Sheets

BAND PASS FILTER

CROSS-REFERENCE TO RELATED APPLICATIONS

This application claims the benefit under 35 U.S.C § 119(a) of Korean Patent Application No. 10-2018-0110953 filed on Sep. 17, 2018 in the Korean Intellectual Property Office, the entire disclosure of which is incorporated herein by reference for all purposes.

BACKGROUND

1. Field

The following description relates to a band pass filter.

2. Description of Related Art

A communication system may perform wireless communications by transmitting and receiving wireless radio frequency signals in a designated frequency band. For example a communication system may use a filter to transmit and receive wireless radio frequency signals in a designated frequency band.

Depending on the frequency band, an LC resonant filter, a ceramic filter, a surface acoustic wave filter, or a bulk acoustic wave filter may be implemented to transmit and receive wireless radio frequency signals.

An LC resonant filter includes a series LC resonant circuit or a parallel LC resonant circuit, and filters wireless radio frequency signals by series LC resonance or parallel LC resonance. An LC resonant filter may have a series LC resonant circuit disposed on a parallel arm and a parallel LC resonant circuit disposed on a serial arm, and according to a transmission zero formed, determines a stop band and a pass band.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a band pass filter includes: a first circuit unit including a first series LC resonant circuit disposed between a first terminal and a second terminal; a second circuit unit disposed between the first circuit unit and the second terminal, and including a first parallel LC resonant circuit; and a third circuit unit disposed between the first terminal and a ground, and including a second series LC resonant circuit, wherein a resonant frequency of the first circuit unit is in a pass band.

The pass band may be determined by attenuation regions of the second circuit unit and the third circuit unit.

The band pass filter may further include a fourth circuit unit disposed between the ground and a connection node of the first circuit unit and the second circuit unit, and including a third series LC resonant circuit.

The band pass filter may further include a fifth circuit unit disposed between the second terminal and the ground, and including a fourth series LC resonant circuit.

The band pass filter may further include a fifth circuit unit disposed between the first circuit unit and the first terminal, and including a second parallel LC resonant circuit.

The band pass filter may further include a fourth circuit unit disposed between the second terminal and the ground, and including a third series LC resonant circuit.

The band pass filter may further include a fourth circuit unit disposed between the first circuit unit and the first terminal, and including a second parallel LC resonant circuit.

In another general aspect, a band pass filter includes: series circuit units and shunt circuit units, wherein one series circuit unit among the series circuit units includes a series LC resonant circuit, and a resonant frequency of the one series circuit unit is in a pass band of the band pass filter.

The pass band may be determined by attenuation regions of the shunt circuit units and attenuation regions of some series circuit units among the series circuit units, excluding the one series circuit unit.

Each of the some series circuit units may include a parallel LC resonant circuit.

Each of the shunt circuit units may include a series LC resonant circuit.

Among the series circuit units, another series circuit unit, excluding the one series circuit unit, may include a series LC resonant circuit. A resonant frequency of the another series circuit unit may be in the pass band.

The resonant frequency of the one series circuit unit and the resonant frequency of the another series circuit unit may be different from each other.

The resonant frequency of the one series circuit unit and the resonant frequency of the another series circuit unit may be the same.

The series circuit units may include a first series circuit unit and a second series circuit unit disposed between a first terminal and a second terminal. At least one of the first series circuit unit and the second series circuit unit may include a series LC resonant circuit.

The series circuit units may include a third circuit unit disposed between the first terminal and the first circuit unit, and a fourth circuit unit disposed between the second terminal and the second circuit unit. At least one of the third circuit unit and the fourth circuit unit may include a parallel LC resonant circuit.

The series circuit units may further include a capacitor disposed between the first circuit unit and the second circuit unit.

The series circuit units and the shunt circuit units, excluding the capacitor, may be disposed symmetrically with respect to the capacitor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
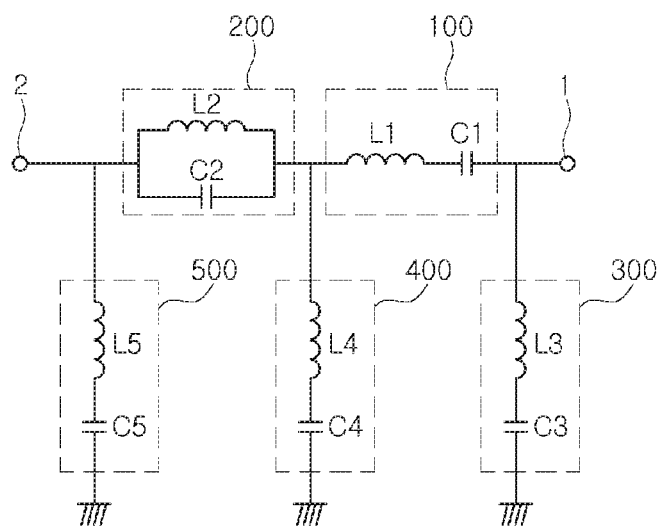
FIGS. 1 to 3 are circuit diagrams of band pass filters, according to embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
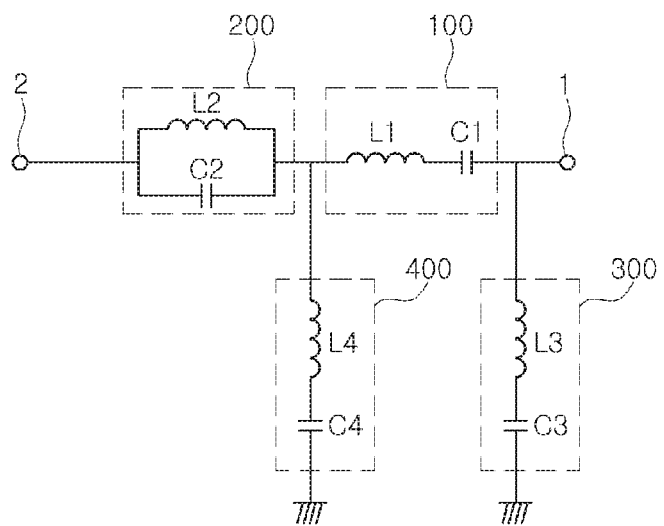
Figure 3:
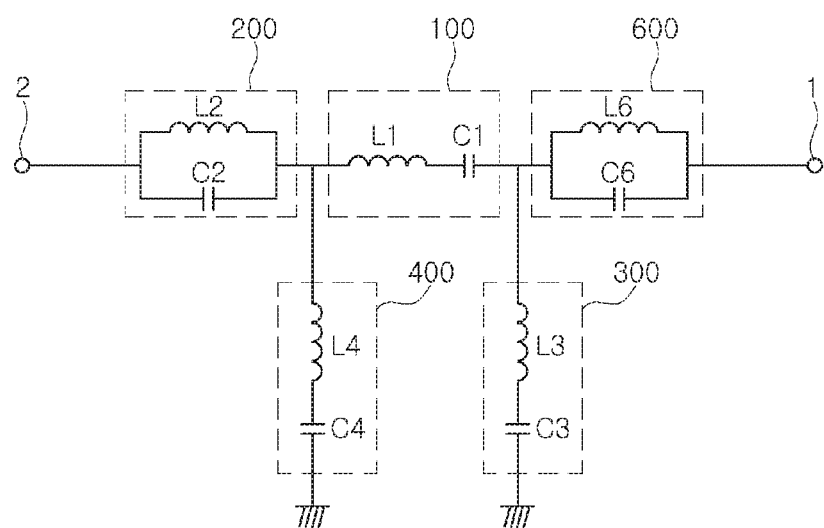

FIGS. 1 to 3 are circuit diagrams of band pass filters, according to various embodiments.

Referring to FIG. 1, a band pass filter 10 may include a first terminal 1 and a second terminal 2. The band pass filter 10 may include a first circuit unit 100, a second circuit unit 200, a third circuit unit 300, a fourth circuit unit 400, and a fifth circuit unit 500, disposed between the first terminal 1 and the second terminal 2.

The first circuit unit 100 and the second circuit unit 200 may be disposed between the first terminal 1 and the second terminal 2. The third circuit unit 300 may be disposed between the first terminal 1 and a ground (e.g., between the ground and a connection node of the first circuit unit 100 and the first terminal 1). The fourth circuit unit 400 may be disposed between a ground and a connection node of the first circuit unit 100 and the second circuit unit 200. The fifth circuit unit 500 may be disposed between the second terminal and a ground (e.g., between the ground and a connection node of the second circuit unit 200 and the second terminal 2). In detail, the first circuit unit 100 and the second circuit unit 200 may be understood as being series circuit units, and the third circuit unit 300, the fourth circuit unit 400, and the fifth circuit unit 500 may be understood as being shunt circuit units.

The first circuit unit 100 may include a first LC resonant circuit including an inductor L1 and a capacitor C1, which are connected to each other in series, and the second circuit unit 200 may include a second LC resonant circuit including an inductor L2 and a capacitor C2, which are connected to each other in parallel.

The third circuit unit 300 may include a third LC resonant circuit including an inductor L3 and a capacitor C3, which are connected to each other in series, the fourth circuit unit 400 may include a fourth LC resonant circuit including an inductor L4 and a capacitor C4, which are connected to each other in series, and the fifth circuit unit 500 may include a fifth LC resonant circuit including an inductor L5 and a capacitor C5, which are connected to each other in series.

When the inductor L2 and the capacitor C2 of the second circuit unit 200, which are connected to each other in parallel, resonate in parallel, a signal transferred between the first terminal and the second terminal may be blocked. Accordingly, the second circuit unit 200 may form an attenuation region f2 by a parallel LC resonance.

When the inductor L3 and the capacitor C3 of the third circuit unit 300, which are connected to each other in series, resonate in series, a signal transferred between the first terminal and the second terminal may be bypassed to a ground. Accordingly, the third circuit unit 300 may form an attenuation region f3 by a serial LC resonance.

When the inductor L4 and the capacitor C4 of the fourth circuit unit 400, which are connected to each other in series, resonate in series, a signal transferred between the first terminal and the second terminal may be bypassed to a ground. Accordingly, the fourth circuit unit 400 may form an attenuation region f4 by a serial LC resonance.

When the inductor L5 and the capacitor C5 of the fifth circuit unit 500, which are connected to each other in series, resonate in series, a signal transferred between the first terminal and the second terminal may be bypassed to a ground. Accordingly, the fifth circuit unit 500 may form an attenuation region f5 by a serial LC resonance.

A pass band and a stop band of the band pass filter 10 may be determined by the attenuation regions f2, f3, f4, and f5 respectively formed by the second circuit unit 200, the third circuit unit 300, the fourth circuit unit 400, and the fifth circuit unit 500.

When the inductor L1 and the capacitor C1 of the first circuit unit 100, which are connected to each other in series, resonate in series, a signal being transferred between the first terminal and the second terminal may pass the first circuit unit 100. A resonant frequency of the first circuit unit 100, which is disposed on a serial arm, may be in a pass band of the band pass filter 10.

According to the embodiment described in FIG. 1, a resonant frequency of the first circuit unit 100, which is disposed on a serial arm and includes a series LC resonant circuit, may be formed in the pass band of a band pass filter 10, to reduce insertion loss of a radio frequency signal in the pass band.

The second circuit unit 200, the third circuit unit 300, the fourth circuit unit 400, and the fifth circuit unit 500 in FIG. 1 may be appropriately modified according to the pass band being designed.

For example, referring to FIG. 2, depending on the pass band being designed, the fifth circuit unit 500 of FIG. 1 may be omitted in a filter 10a. In a filter 10b according to another example shown in FIG. 3, in addition to omitting the fifth circuit unit 500 of FIG. 1, a sixth circuit unit 600 having a same configuration of an inductor and a capacitor as the second circuit unit 200 may be additionally disposed between the first terminal 1 and the first circuit unit 100. That is, the sixth circuit unit 600 may include an inductor L6 and a capacitor C6 connected to each other in parallel.

Band pass filters, according to embodiments, may be connected repeatedly in cascade. According to another embodiment, a capacitor may be disposed between band pass filters that are connected in cascade to improve a Q factor.

In addition, the band pass filters, according to embodiments, may be provided symmetrically with respect to a certain point. According to other embodiments, the band pass filters may be provided symmetrically with respect to a capacitor additionally disposed to improve a Q factor.

Additional embodiments will be described below in detail with focus placed on the band pass filter 10 according to FIG. 1 for increased conciseness. However, descriptions below may still apply to the band pass filters 10a and 10b according to the embodiments in FIG. 2 and FIG. 3, respectively.

Figure 4:
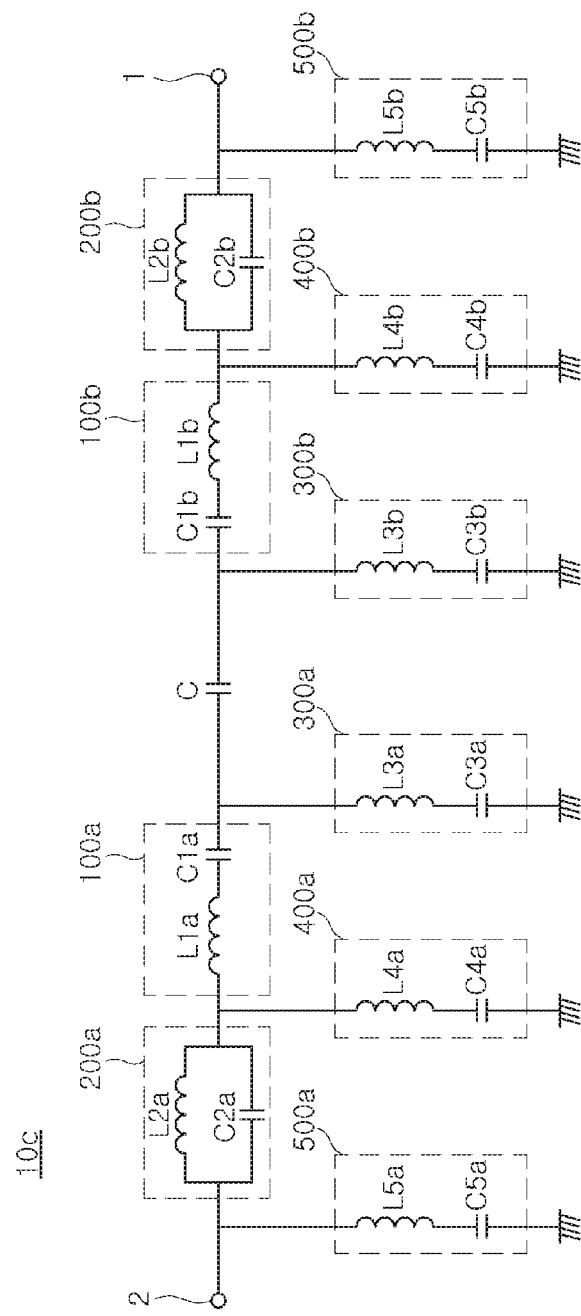
FIGS. 4 and 5 are circuit diagrams of band pass filters, according to embodiments that include modifications to the embodiment of FIG. 1.
Figure 5:
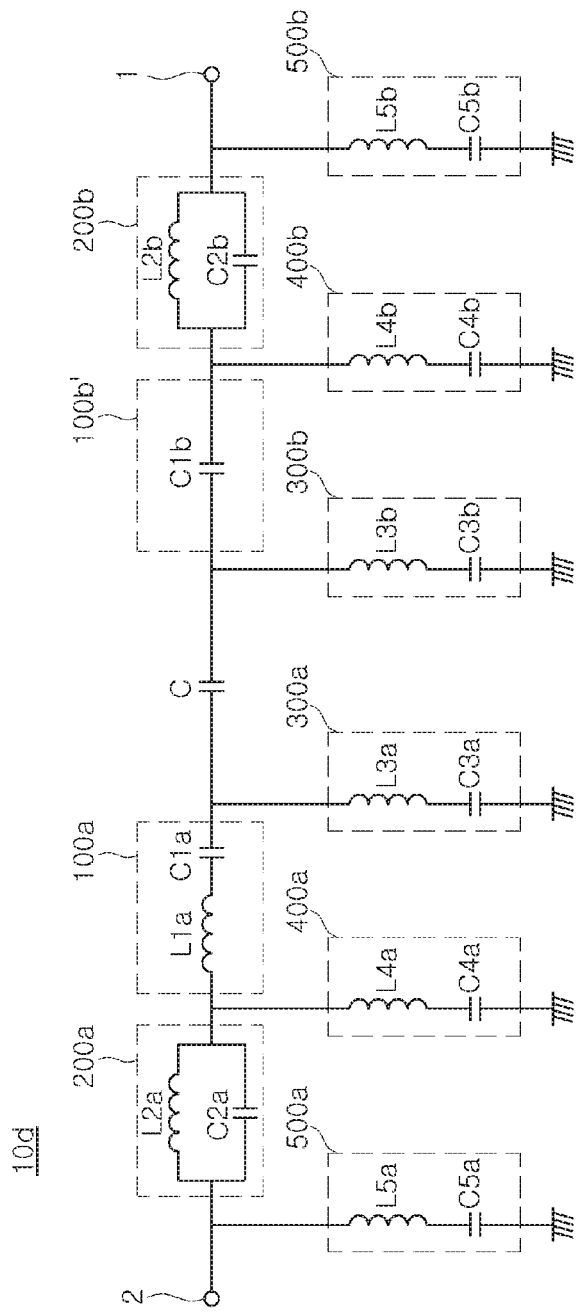

FIG. 4 and FIG. 5 are circuit diagrams of band pass filters 10c and 10d, respectively, according to embodiments that include modifications to the embodiment of FIG. 1.

Since the band pass filters 10c and 10d according to the embodiments in FIG. 4 and FIG. 5 are similar to the band pass filter 10 according to the embodiment in FIG. 1, descriptions will be given below with an emphasis placed on differences.

Referring to FIG. 4, the band pass filter 10c may include a first circuit unit 100a, a second circuit unit 200a, a third circuit unit 300a, a fourth circuit unit 400a, and a fifth circuit unit 500a configured similarly to the first circuit unit 100, the second circuit unit 200, the third circuit unit 300, the fourth circuit unit 400, and the fifth circuit unit 500, respectively, in FIG. 1. The band pass filter 10c may further include a sixth circuit unit 100b, a seventh circuit unit 200b, an eighth circuit unit 300b, a ninth circuit unit 400b, and a tenth circuit unit 500b, configured similarly to the first circuit unit 100, the second circuit unit 200, the third circuit unit 300, the fourth circuit unit 400, and the fifth circuit unit 500, respectively, in FIG. 1.

The first circuit unit 100a, the second circuit unit 200a, the third circuit unit 300a, the fourth circuit unit 400a, and the fifth circuit unit 500a in FIG. 4 each include capacitors and inductors corresponding to the capacitors and inductors included in the second circuit unit 200, the third circuit unit 300, the fourth circuit unit 400, and the fifth circuit unit 500, respectively, in FIG. 1. Thus, the capacitors and inductors in the first circuit unit 100a, the second circuit unit 200a, the third circuit unit 300a, the fourth circuit unit 400a, and the fifth circuit unit 500a are indicated in FIG. 4 by reference characters similar to those of corresponding capacitors and inductors in FIG. 1, but additionally including the letter "a."

The sixth circuit unit 100b, the seventh circuit unit 200b, the eighth circuit unit 300b, the ninth circuit unit 400b, and the tenth circuit unit 500b in FIG. 4 each include capacitors and inductors corresponding to the capacitors and inductors included in the second circuit unit 200, the third circuit unit 300, the fourth circuit unit 400, and the fifth circuit unit 500, respectively, in FIG. 1. Thus, the capacitors and inductors in the sixth circuit unit 100b, the seventh circuit unit 200b, the eighth circuit unit 300b, the ninth circuit unit 400b, and the tenth circuit unit 500b are indicated in FIG. 4 by reference characters similar to those of corresponding capacitors and inductors in FIG. 1, but additionally including the letter "b."

For example, the first circuit unit 100a, the second circuit unit 200a, the third circuit unit 300a, the fourth circuit unit 400a, and the fifth circuit unit 500a may be provided symmetrically with the sixth circuit unit 100b, the seventh circuit unit 200b, the eighth circuit unit 300b, the ninth circuit unit 400b, and the tenth circuit unit 500b.

In addition, the band pass filter 10c may additionally include a capacitor C. When the band pass filter 10 additionally includes the capacitor C, the first circuit unit 100a, the second circuit unit 200a, the third circuit unit 300a, the fourth circuit unit 400a, and the fifth circuit unit 500a may be provided symmetrically with the sixth circuit unit 100b, the seventh circuit unit 200b, the eighth circuit unit 300b, the ninth circuit unit 400b, and the tenth circuit unit 500b, with respect to the capacitor C.

For example, resonant frequencies of the first circuit unit 100a and the second circuit unit 100b may be in a pass band of the band pass filter 10c, and the resonant frequencies of the first circuit unit 100a and the second circuit unit 100b may be different from each other.

The resonant frequencies of the first circuit unit 100a and the second circuit unit 100b in a pass band may be designed to be to be different from each other to effectively reduce insertion loss of a radio frequency signal in the pass band. Alternatively, according to another embodiment, the resonant frequencies of the first circuit unit 100a and the second circuit unit 100b may be designed to be identical.

Although in the above embodiment, the first circuit unit 100a, the second circuit unit 200a, the third circuit unit 300a, the fourth circuit unit 400a, and the fifth circuit unit 500a are symmetrically provided with the sixth circuit unit 100b, the seventh circuit unit 200b, the eighth circuit unit 300b, the ninth circuit unit 400b, and the tenth circuit unit 500b, according to another embodiment, some of the circuit units may be omitted. For example, among the first circuit unit 100a, the second circuit unit 200a, the third circuit unit 300a, the fourth circuit unit 400a, and the fifth circuit unit 500a, the fifth circuit unit 500a may be omitted, and among the sixth circuit unit 100b, the seventh circuit unit 200b, the eighth circuit unit 300b, the ninth circuit unit 400b, and the tenth circuit unit 500b, the seventh circuit unit 200b may be omitted.

Referring to FIG. 5, the band pass filter 10d is similar to the band pass filter 10c of FIG. 4, except that the band pass filter 10d includes a sixth circuit unit 100b' instead of the sixth circuit unit 100b in the band pass filter 10c. The sixth circuit unit 100b' omits the inductor L1b of the sixth circuit unit 100b, and only includes the capacitor C1b.

Figure 6:
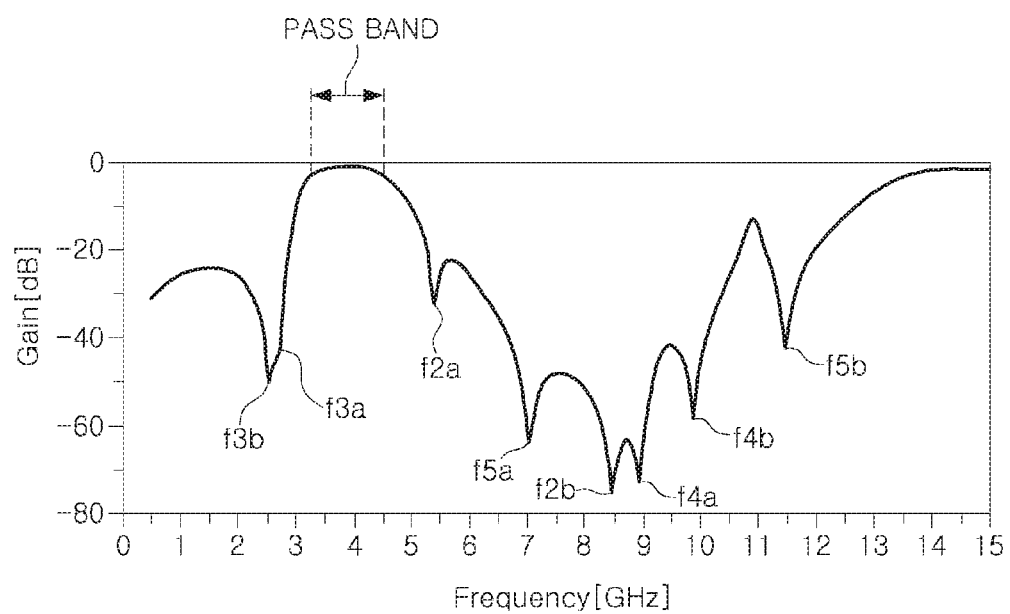
FIG. 6 is a graph showing insertion loss characteristics of band pass filters according to the embodiments in FIG. 4 and FIG. 5.

FIG. 6 is a graph showing insertion loss characteristics of the band pass filters 10c and 10d according to the embodiments in FIG. 4 and FIG. 5, respectively.

Referring to FIGS. 4 to 6, a 2a-th attenuation region f2a, a 3a-th attenuation region f3a, a 4a-th attenuation region f4a, and a 5a-th attenuation region f5a are formed by the second circuit unit 200a, the third circuit unit 300a, the fourth circuit unit 400a, and the fifth circuit unit 500a, respectively. A 2b-th attenuation region f2b, a 3b-th attenuation region f3b, a 4b-th attenuation region f4b, and a 5b-th attenuation region f5b are formed by the seventh circuit unit 200b, the eighth circuit unit 300b, the ninth circuit unit 400b, and the tenth circuit unit 500b, respectively.

A pass band may be determined by the 2a-th attenuation region f2a, the 3a-th attenuation region f3a, the 4a-th attenuation region f4a, the 5a-th attenuation region f5a, the 2b-th attenuation region f2b, the 3b-th attenuation region f3b, the 4b-th attenuation region f4b, and the 5b-th attenuation region f5b.

Table 1 shows the data showing insertion loss characteristics in a pass band according to the embodiments in FIGS. 4 and 5. Comparative Example in Table 1 only includes the first circuit unit 100a and the sixth circuit unit 100b of embodiment of FIG. 4.

TABLE 1

|  | 3.3 [GHz] | 3.4 [GHz] | 3.8 [GHz] | 4.2 [GHz] |
|---|---|---|---|---|
| Embodiment of FIG. 4 | 2.006 | 1.482 | 0.930 | 1.076 |
| Embodiment of FIG. 5 | 2.034 | 1.567 | 0.982 | 1.022 |
| Comparative Example | 2.817 | 2.160 | 1.067 | 1.433 |

Referring to Table 1, the insertion losses of the embodiments of FIGS. 4 and 5 are lower than the insertion losses of the Comparative Example. According to one embodiment, the resonant frequency of a series LC resonant circuit disposed on a serial arm is formed in the pass band of the band pass filter 10c/10d, so the insertion loss of a radio frequency signal may be reduced.

Also, the embodiment of FIG. 4 may reduce the insertion loss of a wireless radio frequency signal in the pass band more effectively than the embodiment of FIG. 5, which only includes the sixth circuit unit 100b' including only the capacitor C1b.

According to the embodiments disclosed herein, a band pass filter may effectively reduce insertion loss.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A band pass filter, comprising:
series circuit units and shunt circuit units,
wherein the series circuit units comprise a first series circuit unit, a second series circuit unit, and a capacitor disposed between the first series circuit unit and the second series circuit unit,
wherein the first series circuit unit and the second series circuit unit are disposed between a first terminal and a second terminal, and at least one series circuit unit among the first series circuit unit and the second series circuit unit comprises a series LC resonant circuit and has a resonant frequency in a pass band of the band pass filter, and
wherein the series circuit units and the shunt circuit units, excluding the capacitor, are disposed symmetrically with respect to the capacitor.

2. The band pass filter of claim 1, wherein the pass band is determined by attenuation regions of the shunt circuit units and attenuation regions of two or more series circuit units among the series circuit units, excluding the at least one series circuit unit.

3. The band pass filter of claim 2, wherein each of the two or more series circuit units comprises a parallel LC resonant circuit.

4. The band pass filter of claim 2, wherein each of the shunt circuit units comprises a series LC resonant circuit.

5. The band pass filter of claim 1, wherein, among the series circuit units, another series circuit unit, excluding the at least one series circuit unit, comprises a series LC resonant circuit, and a resonant frequency of the another series circuit unit is in the pass band.

6. The band pass filter of claim 5, wherein the resonant frequency of the at least one series circuit unit and the resonant frequency of the another series circuit unit are different from each other.

7. The band pass filter of claim 5, wherein the resonant frequency of the at least one series circuit unit and the resonant frequency of the another series circuit unit are the same.

8. The band pass filter of claim 1, wherein the series circuit units further comprise a third circuit unit disposed between the first terminal and the first circuit unit, and a fourth circuit unit disposed between the second terminal and the second circuit unit, and wherein either one or both of the third circuit unit and the fourth circuit unit includes a parallel LC resonant circuit.

* * * * *